(12) United States Patent
Jeloka et al.

(10) Patent No.: US 12,744,524 B1
(45) Date of Patent: Sep. 22, 2026

(54) DOUBLE-PUMPED COMMUNICATION CHANNEL USING DOUBLE EDGE-TRIGGERED FLIP-FLOP WITH SCAN FUNCTIONALITY

(71) Applicant: Apple Inc., Cupertino, CA (US)

(72) Inventors: Supreet Jeloka, Austin, TX (US); Bharan Giridhar, Palo Alto, CA (US); Chandan Shantharaj, San Jose, CA (US); Sahil Kapoor, San Jose, CA (US); Bibo Li, San Jose, CA (US); Sai Saketh Divvela, San Jose, CA (US); Diwakar Agarwal, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 8 days.

(21) Appl. No.: 19/082,499

(22) Filed: Mar. 18, 2025

(51) Int. Cl.
*H03K 17/51* (2006.01)
*H03K 3/037* (2006.01)
*H03K 19/20* (2006.01)

(52) U.S. Cl.
CPC ............. *H03K 17/51* (2013.01); *H03K 3/037* (2013.01); *H03K 19/20* (2013.01)

(58) Field of Classification Search
CPC ......... H03K 17/51; H03K 3/037; H03K 19/20
See application file for complete search history.

(56) References Cited

U.S. PATENT DOCUMENTS 6,300,809 B1 * 10/2001 Gregor ................ H03K 3/0375 327/200
6,938,225 B2 * 8/2005 Kundu ........... G01R 31/318541 714/727
7,082,560 B2 * 7/2006 Parulkar ........ G01R 31/318541 327/218
7,278,074 B2 * 10/2007 Mitra ............ G01R 31/318541 714/724
7,278,076 B2 * 10/2007 Zhang .............. G01R 31/31816 714/726
8,030,953 B2 * 10/2011 Baruch ........... G01R 31/31703 324/762.01

(Continued)

FOREIGN PATENT DOCUMENTS

CN 102831272 A 12/2012
CN 103018661 A 4/2013

(Continued)

*Primary Examiner* — Adam D Houston
(74) *Attorney, Agent, or Firm* — DICKINSON WRIGHT RLLP

(57) ABSTRACT

A double-pumped communications channel utilizing a double-edge-triggered flip-flop is disclosed. The double-edge-triggered flip-flop includes first and second latches configured to latch first and second bits, respectively, on respective ones of rising and falling edges of a clock signal. A shadow latch is coupled to an output of one of the first or second latches and is configured to, during a test mode, a third bit from the coupled one of the first or second latches. During an operational mode, the flip-flop circuit is configured to relay data, via a first output, on alternating edges of the clock signal. During a test mode, the flip-flop circuit is configured to relay test data on a clock edge opposite of the one to which the coupled one of the first or second latches is responsive. A plurality of double-edge-triggered flip-flop circuits may be coupled in series to form a communications channel.

20 Claims, 9 Drawing Sheets

(56) References Cited

U.S. PATENT DOCUMENTS 8,656,238 B2 * 2/2014 Lee ........................ G06F 11/24 714/731
8,786,344 B2 * 7/2014 Salling .............. H03K 19/0013 327/212
9,287,858 B1 * 3/2016 Singhal ............. H03K 3/35625
9,425,771 B2 * 8/2016 Nandi .................... H03K 3/012
9,599,672 B2 * 3/2017 Abhishek ....... G01R 31/318552
10,712,389 B2 7/2020 Alzheimer
10,977,404 B1 4/2021 Reddy
11,380,835 B2 * 7/2022 Schneider ............ H03K 19/195
11,680,983 B1 * 6/2023 Jarrar ............... G01R 31/31725 714/734
11,940,494 B2 3/2024 Son
12,531,547 B2 * 1/2026 Tang .................... H03K 3/0233
12,601,784 B2 * 4/2026 Kulkarni ............ G01R 31/3177
2004/0041610 A1 * 3/2004 Kundu ........... G01R 31/318541 327/215
2006/0242515 A1 * 10/2006 Alvamani ...... G01R 31/318547 714/729
2014/0149773 A1 5/2014 Huang
2016/0365856 A1 * 12/2016 Ye ..................... H03K 3/35625
2017/0115352 A1 * 4/2017 Jayaraman .............. G06F 11/00
2020/0106424 A1 * 4/2020 Venugopal ........... H03K 19/096
2021/0382518 A1 * 12/2021 Uytterhoeven ....... G06F 30/392
2024/0333265 A1 * 10/2024 Rasouli .............. G01R 31/3177
2024/0337692 A1 10/2024 Kumar
2024/0404613 A1 * 12/2024 Casarsa .................. G11C 29/32
2025/0373233 A1 * 12/2025 Huber .................. H03K 3/0372
2026/0095160 A1 * 4/2026 Khawas ............... H03K 3/0372

FOREIGN PATENT DOCUMENTS

CN 118584290 A 9/2024
KR 20230068957 A 5/2023
WO WO-2007138387 A1 * 12/2007 ......... G01R 31/2836
WO WO-2019106225 A1 * 6/2019 ........... G06F 1/3296
WO WO-2019106226 A1 * 6/2019 ........... G06F 1/3237

* cited by examiner

DOUBLE-PUMPED COMMUNICATION CHANNEL USING DOUBLE EDGE-TRIGGERED FLIP-FLOP WITH SCAN FUNCTIONALITY

FIELD

The described embodiments relate generally to electronic circuits, and more particularly, to flip-flop circuits.

BACKGROUND

Modern integrated circuits may use large numbers of storage circuits. One commonly used storage circuit is known as a flip-flop. A flip-flop is a clocked circuit that may receive and store an incoming bit in accordance with a clock signal. Typical flip-flops may be triggered to receive a value in response to an edge (e.g., the rising edge) of a correspondingly received clock signal. In response to the edge of the clock signal, a bit may be stored and furthermore, may be available on an output of the flip-flop.

A common application of flip-flop circuits is in communications channels. For example, a single-bit communications channel may be formed by coupling two or more flip-flops in series. A stream of bits may be conveyed in such a communications channel, with bits being conveyed from one flip-flop to the next in accordance with a clock signal.

DETAILED DESCRIPTION

As the functionality of modern integrated circuits increases, the demand for on-chip circuit area to perform various functions also increase, even as individual feature sizes decrease. As a result, some functions may not be realizable or may otherwise be compromises when competing for circuit area with other functions.

In some cases, different techniques may be utilized to save circuit area. For example, serial communications channels may be used in lieu of transmitting bits in parallel. However, even with serial communications channels may compete for circuit area with circuits utilized for other functions.

The present disclosure is directed to a double-edge-triggered flip-flop circuit capable storing two different bits on alternating clock edges within the same cycle of a clock signal, as well as outputting different bits on alternating edges of the clock cycle. Using a number of these flip-flops coupled in a series configuration, communications channels may be formed such that two bits at a time may be transferred through a single-bit channel. In various embodiments, the flip-flop circuits are configured with circuitry to support scan-test operations in addition to the circuitry supporting non-test operations. Clock-gating circuitry configured to selectively inhibit the clock signal from being provided to inactive ones of the flip-flop circuits in a communications is also disclosed.

Various embodiments of a flip-flop circuit in accordance with the disclosure and applications thereof are now discussed in further detail below. Embodiments of a double-edge-triggered flip-flop circuit are described along with their support for scan test functionality. Thereafter, the discussion continues with a description of a communications channel formed using the flip-flop circuits of the present disclosure. Clock-gating circuitry usable with a communications channel in accordance with the disclosure is also explained, along with a method for operating the flip-flop circuit. The disclosure concludes with description of a device which may implement the various circuits of the disclosure, various system applications which may incorporate the circuits of the disclosure, and a non-transitory computer readable medium storing instructions for manufacturing a circuit of the disclosure.

Figure 1A:
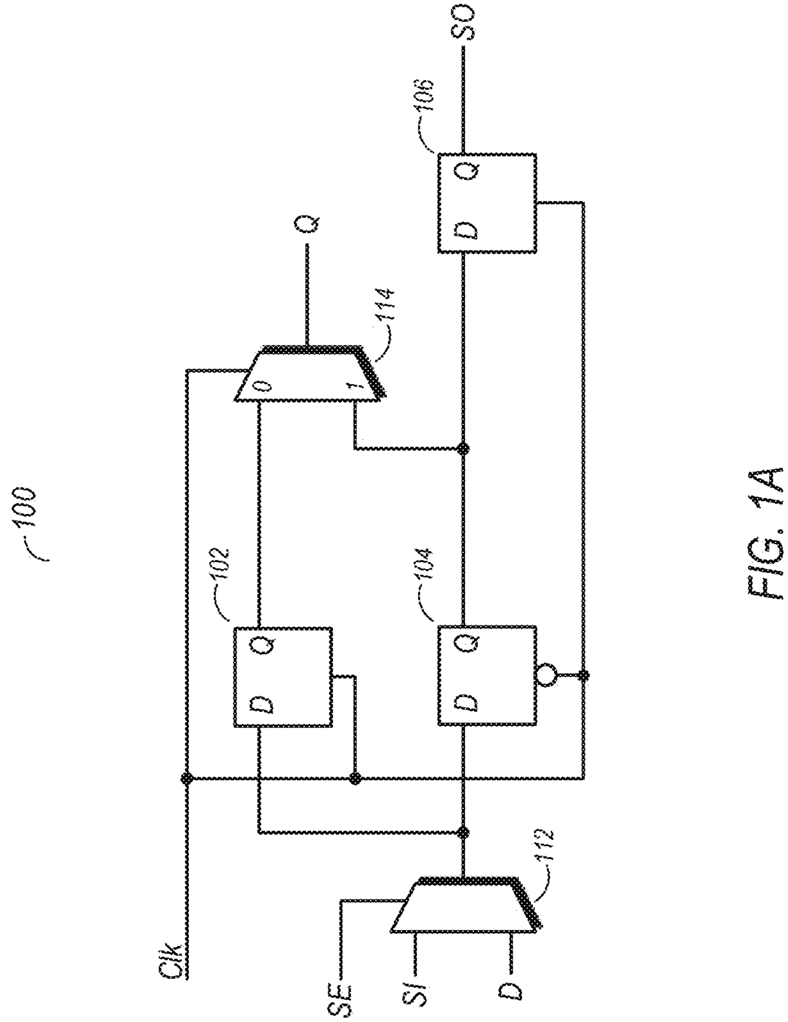
FIG. 1A is a block diagram depicting one embodiment of a double-edge-triggered flip-flop with scan functionality.

Double-Edge-Triggered Flip-Flop Circuit:

FIG. 1A is a block diagram depicting one embodiment of a double-edge-triggered flip-flop with scan functionality. In the embodiment shown, flip-flop circuit 100 is configured to receiving a bit of an input signal and providing a bit of an output signal on each edge of a clock signal. Flip-flop circuit includes a first latch 102 and a second latch 104, which are level sensitive latch circuits in various embodiments.

First latch 102 is configured to receive a first bit in response to the rising edge of the clock signal, and is transparent when the clock signal is high. Accordingly, first latch 102 may be referred to as the positive latch of flip-flop circuit 100. Second latch 104 in the embodiment shown is configured to receive a second bit in response to the falling edge of the clock signal, and is thus transparent when the clock signal is low. Accordingly, second latch 104 may be referred to as the negative latch of flip-flop circuit 100. Due to the arrangement of first latch 102 and second latch 104, bits of data may be received and stored by flip-flop circuit 100 on every clock signal edge, both rising and falling, when in the operational mode. The operational mode is defined herein as a non-test mode in which flip-flop circuit 100 is performing its intended function.

Bits of data may be received, during the operational mode, via the 'D' input of selection circuit 112. In normal operation, the scan enable ('SE') signal which acts as the selection signal is received in a state in which the 'D' input is selected. Due to the arrangement of first latch 102 and second latch 104, flip-flop circuit 100 is configured to receive and store a bit of data every half-clock cycle—in latch 102 in response to the positive (high) level of the clock signal, and in latch 104 in response to the negative (low) level of the clock signal.

Flip-flop circuit 100 in the embodiment shown also includes an output selection circuit 114. During an operational mode, flip-flop circuit 100 is configured to relay data, via a first output, from the first latch and the second latch on alternating edges of the clock signal. The operational mode as defined herein is a non-test mode when flip-flop circuit 100 is carrying out its intended function. As shown in FIG. 1A, output selection circuit 114 is coupled to receive the clock signal as a selection signal, and is configured to provide an output signal on the Q output. As arranged as shown here, selection signal is configured to select an output signal from the one of the latches that is not transparent. Thus, when the clock signal is low, output selection circuit 114 is configured to select the output signal from the output of first latch 102, which is transparent when the clock signal is high. When the clock signal is high, selection circuit 114 is configured to select the output signal from second latch 104, which is transparent when the clock signal is high. The arrangement shown allows flip-flop circuit 100 to output a bit each half-clock cycle, both in response to the positive edge of the clock signal as well as the negative edge of the clock signal.

Flip-flop circuit 100 in the embodiment shown also includes a third latch 106, which may be referred to as a shadow latch. Third latch 106 in this example includes an input that is coupled to the output of second latch 104. However, embodiments are possible and contemplated in which an input of third latch 106 is instead coupled to an output of first latch 102.

When arranged as shown in FIG. 1A, third latch 106 may be further referred to as a shadow positive latch, as it is transparent during the high phase of the clock signal (and thus, responsive to the clock signal's positive edge). In embodiments where the input of third latch 106 is coupled to the output of first latch 102, it may be referred to as a shadow negative latch, as it is transparent during the low phase of the clock signal (and thus responsive to the clock signal's negative edge).

Third latch 106 in the embodiment shown provides scan functionality, and thus flip-flop circuit 100 supports scan test operations. Scan data may be input into flip-flop circuit 100 via the scan input ('SI') during test mode operations. Test mode operations may be carried out when the scan enable ('SE') signal is asserted, causing selection of the scan input by input selection circuit 112. Scan data may be initially input into second latch 104 in response to the negative edge of the clock signal. On the subsequent rising edge of the clock signal, third latch 106 becomes transparent to receive and store test data output from second latch 104. Third latch 106 is configured to output test data through the SO output.

Figure 1B:
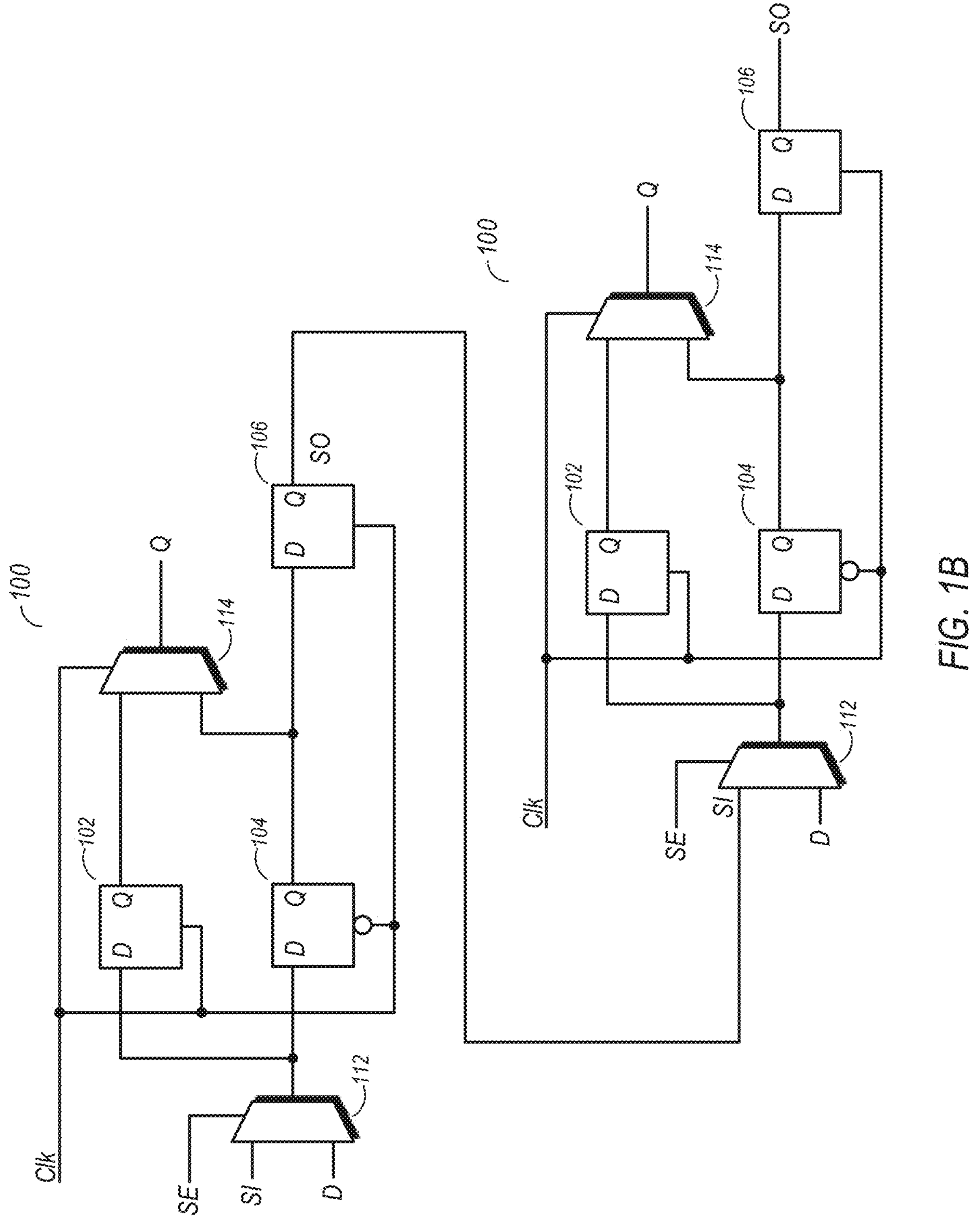
FIG. 1B is a block diagram illustrating connections for scan testing of one embodiment of a double-edge-triggered flip-flop.

FIG. 1B is a block diagram illustrating connections for scan testing of one embodiment of a double-edge-triggered flip-flop. In the illustrated example, two instances of flip-flop circuit 100 are coupled to one another to form a portion of a scan chain. The scan data output of a first flip-flop circuit 100 is coupled to the scan data input of a second flip-flop circuit 100. Longer scan chains with additional flip-flop circuits may be formed in this manner to enable the shifting in of test data for test operations. After applying the test input data as stimulus, the flip-flop circuits 100 may capture the resulting test output data through their respective scan data inputs. Thereafter, the test output data may be shifted from the integrated circuit in which flip-flop circuits 100 are implemented.

Figure 2:
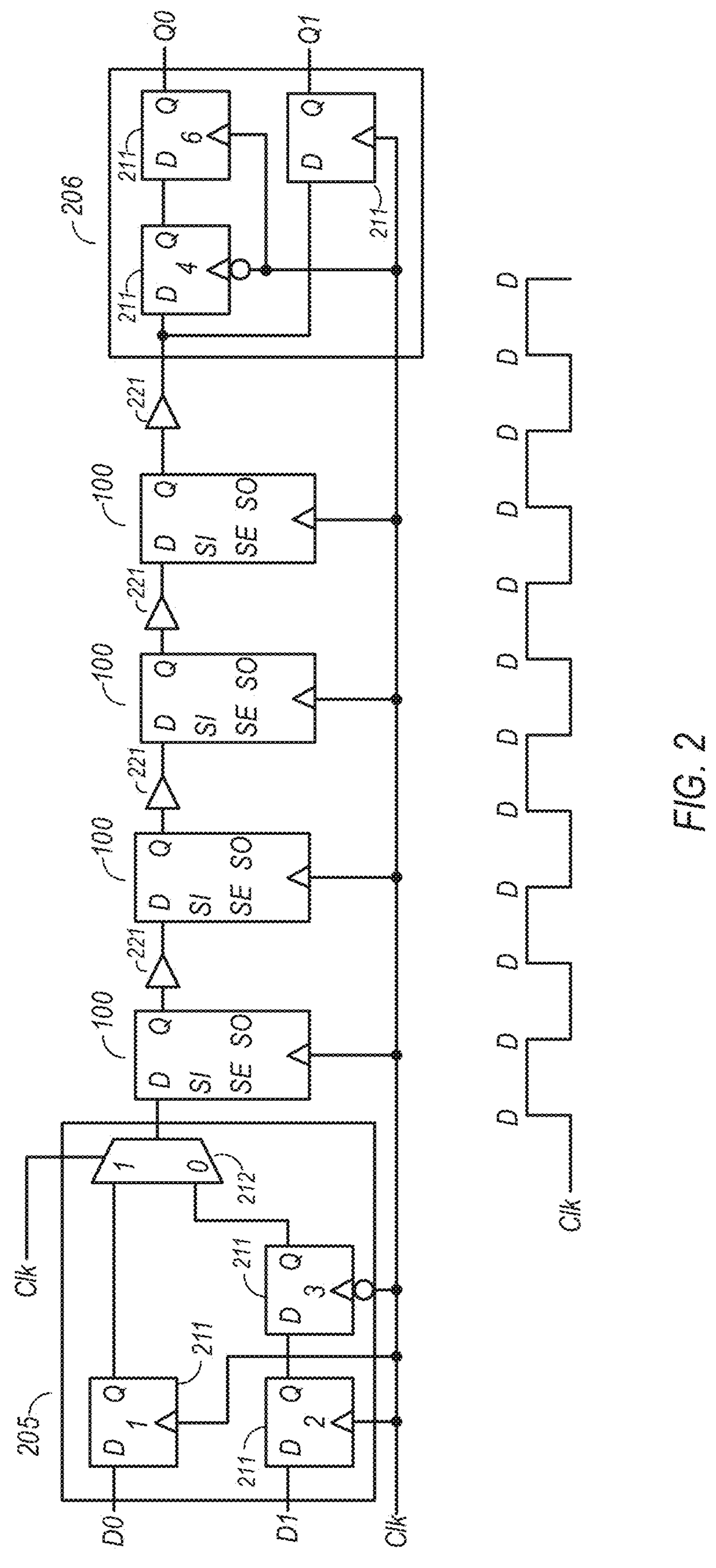
FIG. 2 is a diagram illustrating one embodiment of a communications channel utilizing double-edge-triggered flip-flops.

It is noted that while the embodiment shown in FIG. 1B illustrates a shadow latch 106 coupled to the negative latch 104 of each of the illustrated flip-flop circuits, other embodiments are possible and contemplated. For example, embodiments with shadow latch 106 coupled to positive latch 102 are also possible and contemplated, as are embodiments in which a shadow latch is coupled to each of positive latch 102 and negative latch 104. The disclosure also contemplates embodiments with no shadow latch in which the positive and negative latches are coupled in series are also possible and contemplated Communications Channel:

FIG. 2 is a diagram illustrating one embodiment of a communications channel utilizing double-edge-triggered flip-flops. In the illustrated example, a communications channel 200 is formed of a plurality of series-coupled flip-flop circuits 100 (four in this non-limiting example). When coupled in series as shown, an output selection circuit of one of the flip-flop circuits 100 may be coupled to an input selection circuit of the next one of the flip-flop circuits 100 in the series-coupled chain. In the embodiment shown, communications channel 200 includes optional buffers 221 coupled to the outputs to ones of the flip-flop circuits 100.

On one end of communications channel 200 is a serializer circuit 205 configured to generate a serialized signal comprising a plurality of bits to be transmitted in series into the communications channel 200. Serializer circuit 205 as shown here includes two different inputs, D0 and D1, configured to receive a plurality of bits in parallel, and output these bits in a serial stream. Serializer circuit 205 includes three flip-flops 211 and a selection circuit 212. A first one of flip-flops 211 (labeled 1) is coupled to receive data bits via the D0 input, and includes an output directly coupled to one of the inputs of selection circuit 212. A second flip-flop 211 (labeled 2) is coupled to receive data bits via the D1 input, with its output coupled to a third flip-flop 211 (labeled 3). The third flip-flop 211 in this embodiment is transparent to the low phase of the clock signal and thus responds to its negative edge. Data may be received and stored into the first and second flip-flop 211, via the D0 and D1 inputs, respectively, when the clock signal is high.

Selection circuit 212 includes a selection input coupled to receive the clock signal, Clk. When the clock signal is low (0), the output from the first flip-flop 211 (which is transparent when the clock signal is high) is selected. Furthermore, when the clock signal is low, the third flip-flop 211 is transparent, and may receive and store a bit received from the second flip-flop 211. When the clock signal is high (1), the output from the third flip-flop 211 is selected by selection circuit 212.

Data bits propagated into the chain of serially-coupled flip-flops 100 may be propagated from one to the next on every clock edge. Data bits received via the D0 input and data bits received via the D1 input may propagated through communications channel 200 on alternating clock edges.

A de-serializer circuit 206 configured to de-serialize the serialized signal received from the plurality of series-coupled flip-flop circuits is coupled to the receiving end of communications channel 200. De-serializer circuit 206 includes fourth, fifth, and sixth flip-flops 211 (labeled 4, 5, and 6, respectively). When the clock signal is low, a data bit from the chain of serially-coupled flip-flops 100 is latched into the fourth flip-flop 211. When the clock signal is high, a data bit from the chain of serially-coupled flip-flops 100 is latched into the fifth flip-flop 211, while the data bit previously latched into the fourth flip-flop 211 (when the clock signal was low) is now latched into the sixth flip-flop 211.

Figure 3A:
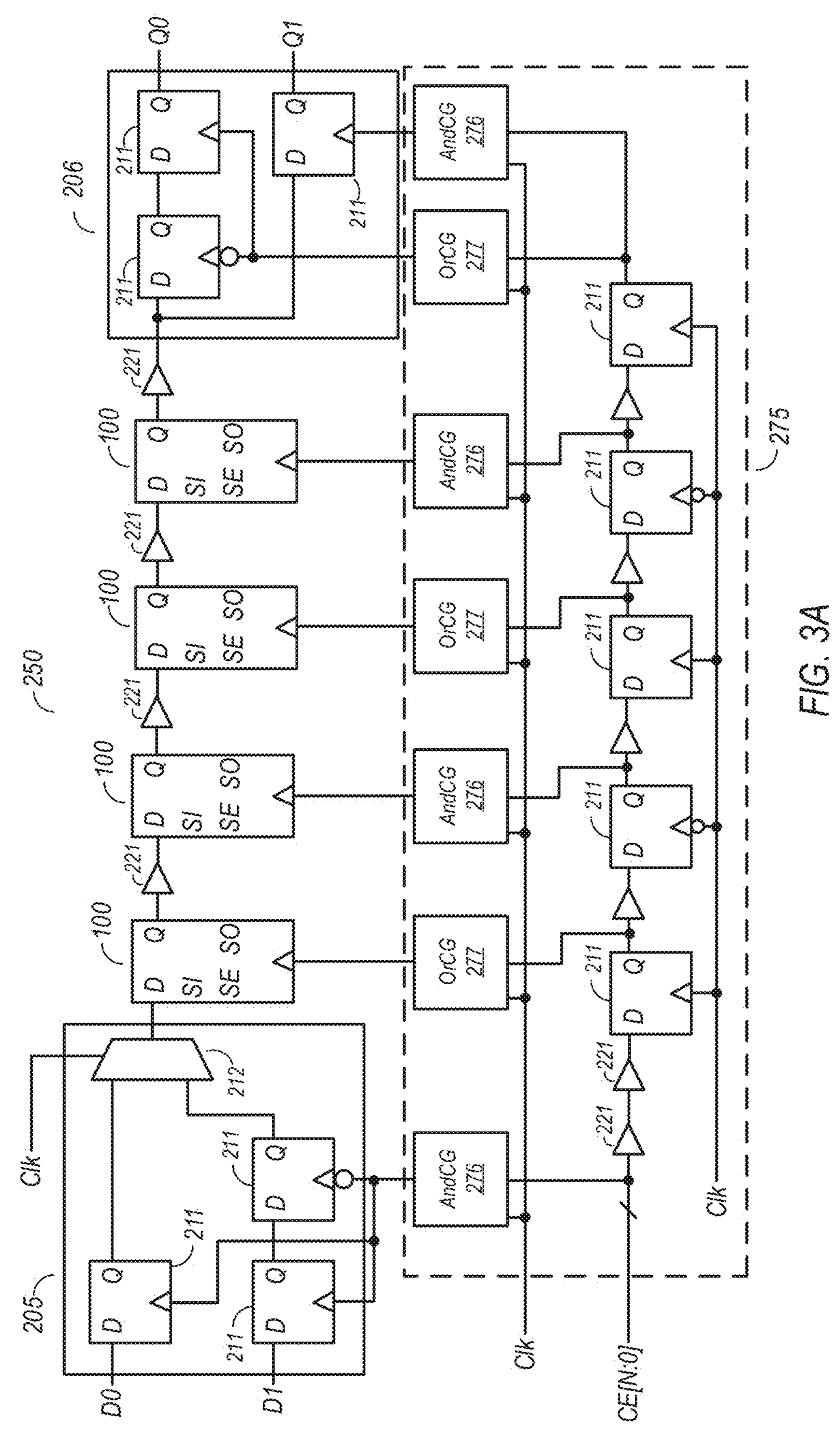
FIG. 3A is a diagram illustrating an embodiment of a communications channel utilizing double-edge-triggered flip-flops with clock-gating circuitry.

Clock-Gating for Communications Channel:

FIG. 3A is a diagram illustrating an embodiment of a communications channel utilizing double-edge-triggered flip-flops with clock-gating circuitry. In the embodiment shown, a clock-gating circuit 275 is coupled to communications channel 250, which includes a serializer 205, a plurality of serially-coupled flip-flop circuit 100, and a de-serializer 206. The flip-flop circuits 100 of communications channel 250 may be the same or variants of those discussed above with reference to FIG. 1A, including the data latches and a shadow latch to support scan test operations.

During operation of communications channel 250, data bits may be persistently transmitted from one end of the channel to the other. However, in some instances, the transmissions of bits may be sporadic. In such instances, it may thus be beneficial to inhibit the clock signal from being provided to inactive ones of the plurality of flip-flop circuits 100, serializer 205, and de-serializer 206.

Clock-gating circuit 275 is thus configured to, in situations where data transmissions are not persistent, to inhibit the clock signal from being provided to inactive ones of the components of communications channel 250, thereby saving power, as power expended during a given clock cycle is not wasted on circuits that are neither receiving or transmitting data on that cycle.

As shown here, clock-gating circuit 275 includes a plurality of AND-type clock gating circuits 276 and a plurality of OR-type clock-gating circuits 277. These circuits are coupled to alternating ones of the circuit elements of communications channel 250. For example, an AND-type clock-gating circuit 276 is coupled to serializer 205, while the first flip-flop circuit 100 that is coupled to the output of serializer 205 is coupled to an OR-type clock-gating circuit 277. De-serializer 206 in this embodiment is coupled to both an OR-type clock-gating circuit and an AND-type clock-gating circuit due to its arrangement. The operation of the example AND-type clock-gating circuits 276 and OR-type clock-gating circuits 277 will be discussed in further detail below.

Clock-gating circuit 275 also includes a plurality of serially-coupled flip-flops 211 and buffers 221 interspersed there between. These flip-flops 211 may propagate a clock enable signal, CE, from one latch to another to enable correspondingly coupled ones of AND-type clock-gating circuits 276 and OR-type clock-gating circuits 277 to enable passage of the clock signal to corresponding circuit elements of communications channel 250. Since the flip-flop circuits 100 of communications channel 250 are double-edge-triggered, the flip-flops 211 of clock-gating circuit 275 are arranged in an alternating pattern such that one flip-flop 211 is triggered on the rising edge of the clock signal while the flip-flop 211 in the chain is triggered on the falling edge of the clock signal. This may ensure that selected circuit elements of communications channel 250 are enabled on a half-clock cycle basis for transmitting or receiving bits of data.

In some embodiments (including that shown), the clock enable signal may be a multi-bit signal, with parallel circuits implemented in the chain of flip-flops 211 of clock-gating circuit 275. This may allow for more flexibility in controlling which elements of communications channel 250 are clock-gated at a given time. In one example of operation, the clock-gating circuit may alternate enabling the clock signal at particular ones of the individual AND-type and OR-type clock-gating circuit on alternate phases of the clock signal.

Figures 3B, 3C:
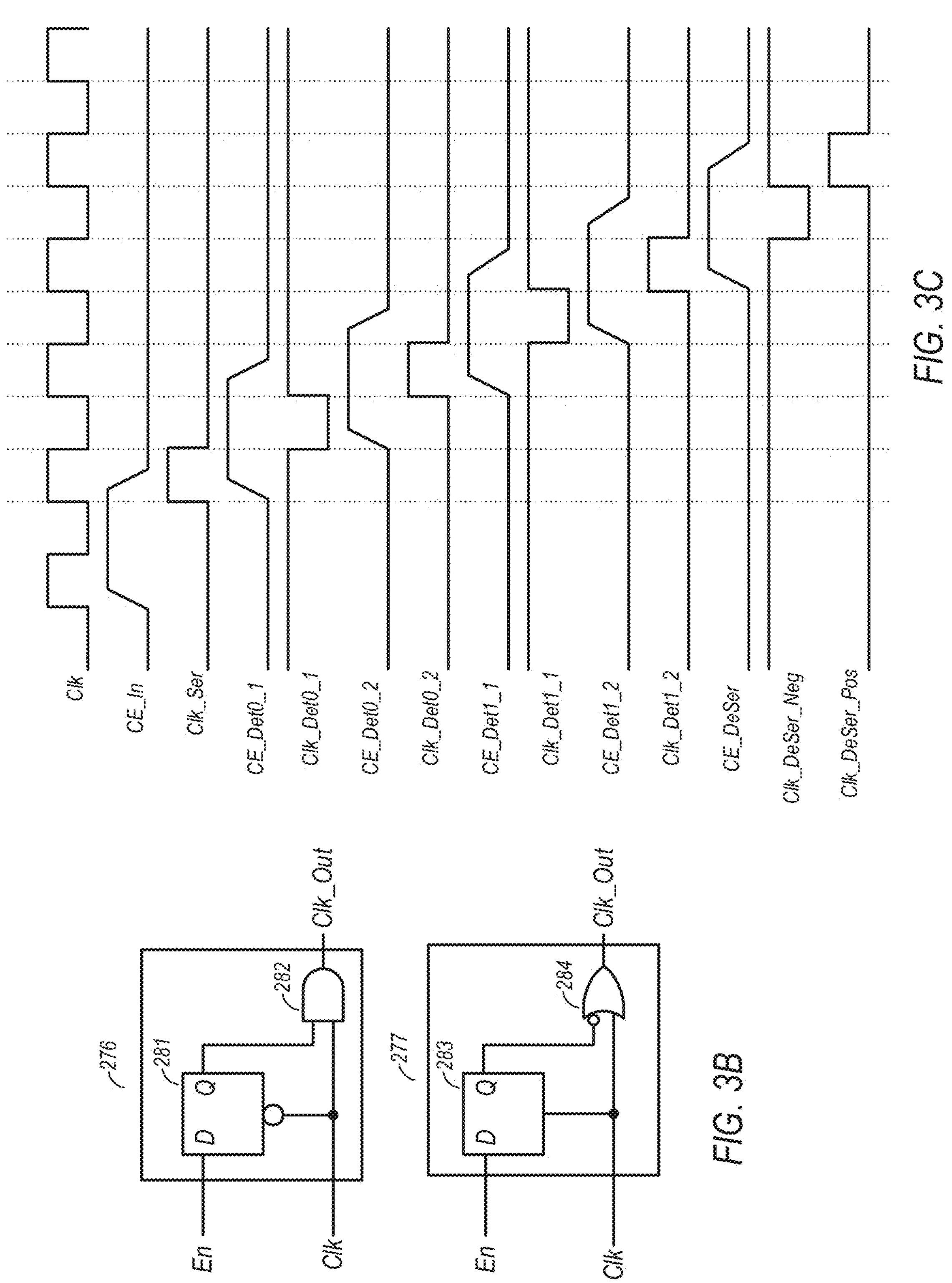
FIG. 3B includes diagrams illustrating embodiments of clock-gating circuits utilized in the embodiment of FIG. 3A.
FIG. 3C is a timing diagram illustrating clock-gating operation for an embodiment of a communications channel in accordance with the disclosure.

FIG. 3B includes diagrams illustrating embodiments of the AND-type and OR-type clock-gating circuits utilized in the embodiment of FIG. 3A. It is noted that other types of clock-gating circuits with other internal circuit arrangements may be used, and thus the disclosure is not limited to those shown here.

AND-type clock-gating circuit 276 in the embodiment shown includes a latch circuit 281 coupled to receive as an input, an enable signal, En. The output of latch 281 is coupled to a first input of AND gate 282. The second input of AND gate 282 is coupled to receive the clock signal, Clk. When the enable signal is a logic high (1), the output of latch 281 is also a logic high, and thus the output of AND gate 282, Clk_Out, follows the Clk input. When the enable signal is a logic low (0), the output of latch 281 is also a logic low, and therefore the output of AND gate 282 is held low irrespective of the current state of the clock signal.

OR-type clock-gating circuit 277 includes a latch 283 and OR gate 284. A first input of OR gate 284 is coupled to the output of latch 283 and is responsive to a logic low. The second input to OR gate 284 is coupled to receive the clock signal. When the enable signal is high, the output of latch 283 is also high. Since the first input of OR gate 284 is responsive to a logic low, it receives a logic low on its first input, and thus the output of OR gate 284 thus follows the clock signal. When the enable signal is low, the first input to OR gate 284 is received as a logic high, thereby causing the output to be held at a logic high irrespective of the state of the clock signal.

It is noted that AND-type clock-gating circuit 276 and OR-gate clock-gating circuit 277 as shown here are simplified versions, and other embodiments that carry out similar functions are possible and contemplated.

FIG. 3C is a timing diagram illustrating clock-gating operation for an embodiment of a communications channel in accordance with the disclosure. In particular, the timing diagram of FIG. 3C illustrates the propagation of a clock enable signal through an embodiment of a clock gating circuit such as clock-gating circuit 275 discussed above with reference to FIG. 3A, and the progressive enabling of active ones of different circuit elements of a communications channel as a bit of data passes from one circuit element to the next while inactive ones of the circuit elements remain clock-gated.

In the illustrated sequence, the input clock enable signal, ClkEn_In is initially input into the clock gating circuit, and thus allows a clock pulse, Clk_Ser to be provided to the serializer circuit. This first clock pulse, which is positive-going, is provided from an AND-type clock gating circuit. After the clock pulse, the clock signal provided to the serializer, Clk_Ser, remains gated by being held low.

The input clock enable signal is subsequently de-asserted, although a clock enable signal continues propagating through the chain of serially-coupled flip-flops of the clock-gating circuit, and is asserted as CE_Det0_1 to an OR-type clock-gating circuit. This allows a negative-going clock pulse to be provided to a flip-flop circuit in accordance with the disclosure. The flip-flop circuit receiving the negative-going pulse may latch data in accordance with the operation described above for flip-flop circuit 100 of FIG. 1A. Following the negative-going pulse, the clock signal to this circuit element remains gated by being held high on the output of the corresponding OR-type clock gating circuit.

The operation described in the previous paragraphs continues, with the clock enable signal being asserted at a given circuit element of the communications channel in time to allow it to store the incoming data bit, with its correspondingly received clock signal remaining gated for the remainder of the operation, both before and after. At the end of the communications channel, AND-type and OR-type clock gating circuits coupled to the de-serializer circuit receive the enable signal as ClkEn_DeSer, allowing both a negative going pulse and a subsequent positive going pulse to put into effect the de-serialization operation.

The timing diagram of FIG. 3C is shown here by way of example in order to illustrate one of the principles of operation of an embodiment of clock-gating circuit 275 as discussed above. In particular, the timing diagram of FIG. 3C is provided to illustrate the ability of various embodiments of clock-gating circuit 275 to selectively and individually clock-gate the various circuit elements that make up communications channel 200 and 250 and various embodiments thereof. The timing diagram is not intended to be limiting and thus does not reflect all possible operating scenarios.

Figure 4:
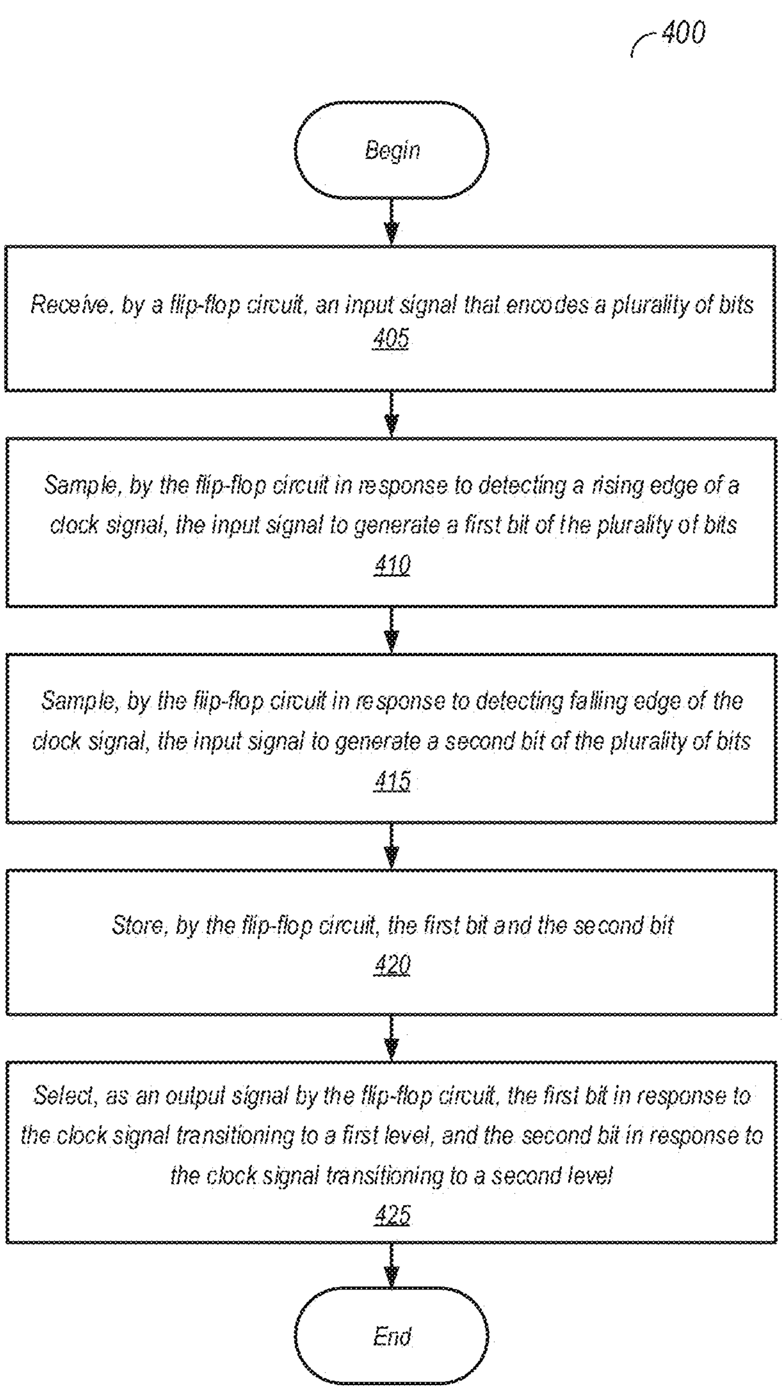
FIG. 4 is a flow diagram illustrating an embodiment of a method for operating a double-edge-triggered flip-flop.

Methods of Operation:

FIG. 4 is a flow diagram illustrating an embodiment of a method for operating a double-edge-triggered flip-flop. Method 400 as shown in FIG. 4 may be carried out by various ones of the apparatus embodiments discussed above. Embodiments of an apparatus capable of carrying out Method 400 and variations thereof are considered to fall within the scope of this disclosure.

Method 400 includes receiving, by a flip-flop circuit, an input data signal that encodes a plurality of bits (block 405). The method further includes sampling, by the flip-flop circuit in response to detecting a rising edge of a clock signal, the input data signal to generate a first bit of the plurality of bits (block 410) and sampling, by the flip-flop circuit in response to detecting falling edge of the clock signal, the input data signal to generate a second bit of the plurality of bits (block 415). The method also includes storing, by the flip-flop circuit, the first bit and the second bit (block 420) and selecting, as an output signal by the flip-flop circuit, the first bit in response to the clock signal transitioning to a first level, and the second bit in response to the clock signal transitioning to a second level (block 425).

In various embodiments, the method further comprises, in response to activating a test mode, receiving, by the flip-flop circuit, an input test signal comprising one or more test data bits and generating, by the flip-flop circuit, an output test signal comprising at least one of the one or more test data bits. The method may also include selecting, using an input selection circuit, one of the input test signal or input data signal depending on a state of a test mode signal.

Various embodiments of the flip-flop circuit disclosed herein include first and second latches. Accordingly, various embodiments of the method include storing, in a first latch of the flip-flop circuit while in an operational mode, the first bit and storing, in a second latch of the flip-flop circuit while in the operational mode, the second bit.

A third latch to support scan test operations is provided in various embodiments of the flip-flop circuit. Accordingly, embodiments of the method include receiving, in the second latch and while in the test mode the input test signal and transferring, while in the test mode, the one of the one or more test data bits of the input test signal from the second latch to a third latch. The method further includes, in the test mode, outputting, from the third latch, the output test signal.

Embodiments of the method include selecting, using an output selection circuit, the first bit from the first latch in response to the clock signal transitioning to the first level while in the operational mode and selecting, using the output selection circuit, the second bit from the second latch in response to the clock signal transitioning to the second level while in the operational mode.

The flip-flop circuit of the present disclosure may be one of a plurality of series-coupled flip-flop circuits forming a communications channel. Accordingly, embodiments of the method include serializing, in a serializer circuit, the plurality of bits, transmitting, from the serializer and through the plurality of series-coupled flip-flop circuits, the plurality of bits, receiving, at a de-serializer circuit and from the plurality of series-coupled flip-flop circuits, the plurality of bits and de-serializing, using the de-serializer circuit, the plurality of bits. Some embodiments of the method may also include inhibiting the clock signal, using a clock-gating circuit, from being provided to inactive ones of the plurality of series-coupled flip-flop circuits, the serializer circuit, and the de-serializer circuit.

Figure 5:
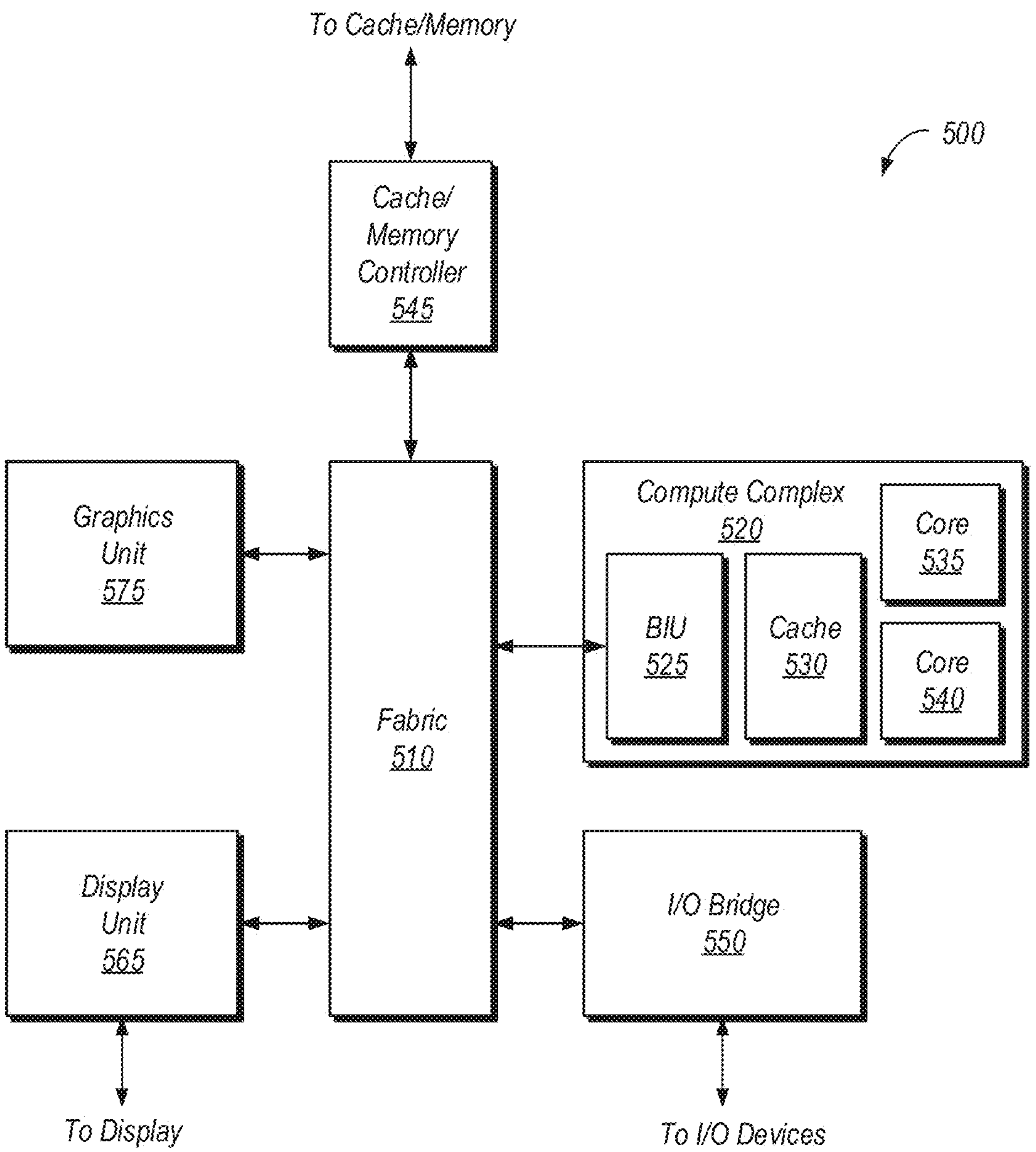
FIG. 5 is a block diagram of an embodiment of a device that includes double-edge-triggered flip-flops in accordance with the disclosure.

Device, System, and Computer Readable Medium:

Referring now to FIG. 5, a block diagram illustrating an example embodiment of a device that may include one or more instances of a double-edge-triggered flip-flop is shown. In various embodiments, device 500 may implement functionality of delay-line circuit 100 as depicted in FIG. 1. In some embodiments, elements of device 500 may be included within a system on a chip. In some embodiments, device 500 may be included in a mobile device, which may be battery-powered. Therefore, power consumption by device 500 may be an important design consideration. In the illustrated embodiment, device 500 includes fabric 510, compute complex 520, input/output (I/O) bridge 550, cache/memory controller 545, graphics unit 575, and display unit 565. In some embodiments, device 500 may include other components (not shown) in addition to, or in place of, the illustrated components, such as video processor encoders and decoders, image processing or recognition elements, computer vision elements, etc.

Fabric 510 may include various interconnects, buses, MUX's, controllers, etc., and may be configured to facilitate communication between various elements of device 500. In some embodiments, portions of fabric 510 may be configured to implement various different communication protocols. In other embodiments, fabric 510 may implement a single communication protocol, and elements coupled to fabric 510 may convert from the single communication protocol to other communication protocols internally.

In the illustrated embodiment, compute complex 520 includes bus interface unit (BIU) 525, cache 530, and cores 535 and 540. In various embodiments, compute complex 520 may include various numbers of processors, processor cores, and caches. For example, compute complex 520 may include 1, 2, or 4 processor cores, or any other suitable number. In one embodiment, cache 530 is a set associative L2 cache. In some embodiments, cores 535 and 540 may include internal instruction and data caches. In some embodiments, a coherency unit (not shown) in fabric 510, cache 530, or elsewhere in device 500, may be configured to maintain coherency between various caches of device 500. BIU 525 may be configured to manage communication between compute complex 520 and other elements of device 500. Processor cores, such as cores 535 and 540, may be configured to execute instructions of a particular instruction set architecture (ISA) which may include operating system instructions and user application instructions. These instructions may be stored in a computer readable medium such as a memory coupled to cache memory controller 545 as discussed below.

As used herein, the term "coupled to" may indicate one or more connections between elements, and a coupling may include intervening elements. For example, in FIG. 5, graphics unit 575 may be described as "coupled to" a memory through fabric 510 and cache/memory controller 545. In contrast, in the illustrated embodiment of FIG. 5, graphics unit 575 is "directly coupled" to fabric 510 because there are no intervening elements.

Cache/memory controller 545 may be configured to manage transfer of data between fabric 510 and one or more caches and memories. For example, cache/memory controller 545 may be coupled to an L3 cache, which may, in turn, be coupled to a system memory. In other embodiments, cache/memory controller 545 may be directly coupled to a memory. In some embodiments, cache/memory controller 545 may include one or more internal caches. Memory coupled to cache/memory controller 545 may be any type of volatile memory, such as dynamic random access memory (DRAM), synchronous DRAM (SDRAM), double data rate (DDR, DDR2, DDR3, etc.) SDRAM (including mobile versions of SDRAMs such as mDDR3, etc., and/or low power versions of SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to cache/memory controller 545 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 520 to cause the computing device to perform functionality described herein.

Graphics unit 575 may include one or more processors, e.g., one or more graphics processing units (GPUs). Graphics unit 575 may receive graphics-oriented instructions, such as OPENGL®, Metal®, or DIRECT3D® instructions, for example. Graphics unit 575 may execute specialized GPU instructions or perform other operations based on the received graphics-oriented instructions. Graphics unit 575 may generally be configured to process large blocks of data in parallel, and may build images in a frame buffer for output to a display, which may be included in the device or may be a separate device. Graphics unit 575 may include transform, lighting, triangle, and rendering engines in one or more graphics processing pipelines. Graphics unit 575 may output pixel information for display images. Graphics unit 575, in various embodiments, may include programmable shader circuitry which may include highly parallel execution cores configured to execute graphics programs, which may include pixel tasks, vertex tasks, and compute tasks (which may or may not be graphics-related).

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display).

I/O bridge 550 may include various elements configured to implement universal serial bus (USB) communications, security, audio, and low-power always-on functionality, for example. I/O bridge 550 may also include interfaces such as pulse-width modulation (PWM), general-purpose input/output (GPIO), serial peripheral interface (SPI), and inter-integrated circuit (I2C), for example. Various types of peripherals and devices may be coupled to device 500 via I/O bridge 550.

In some embodiments, device 500 includes network interface circuitry (not explicitly shown), which may be connected to fabric 510 or I/O bridge 550. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 500 with connectivity to various types of other devices and networks.

Figure 6:
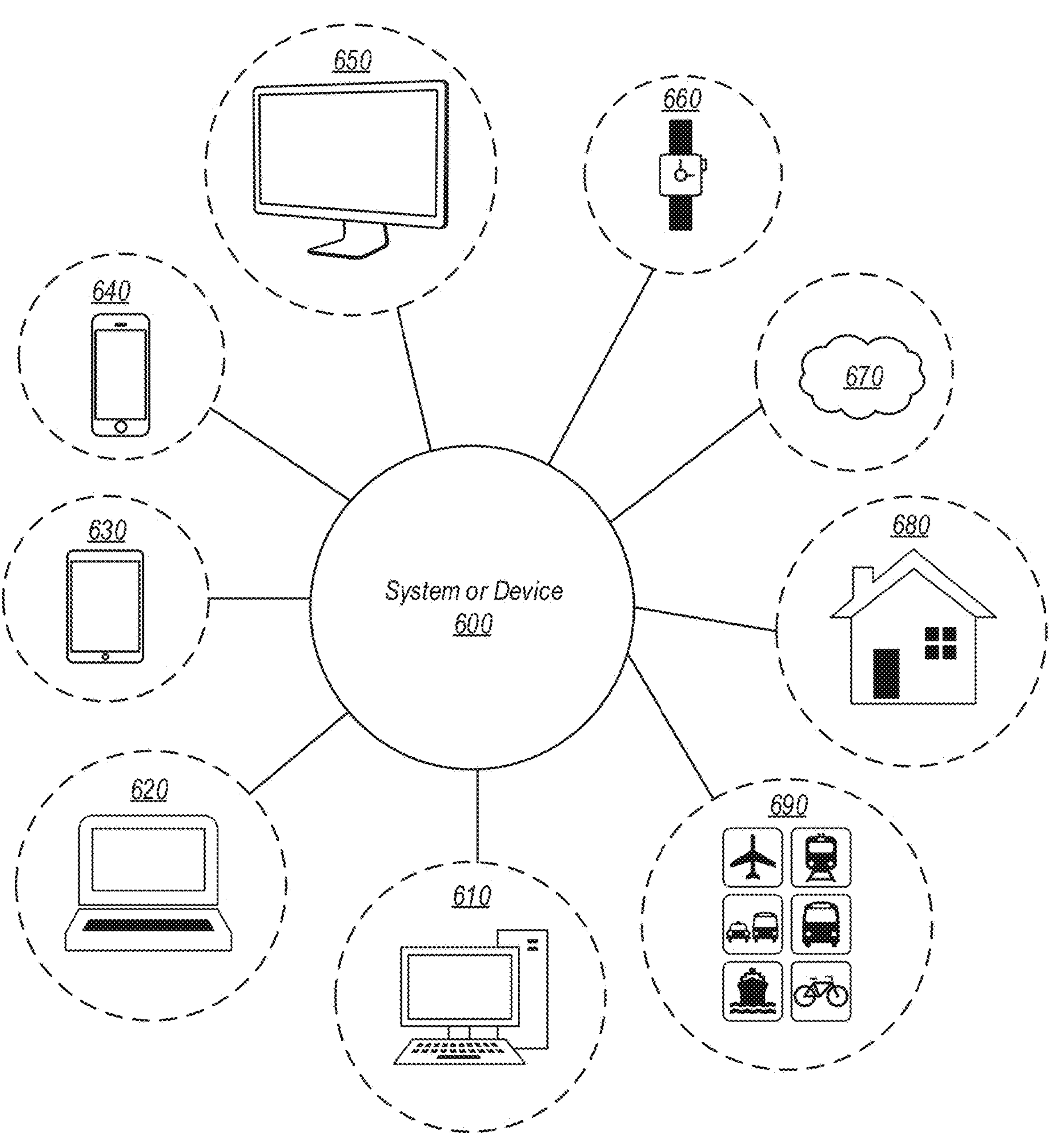
FIG. 6 is a block diagram of various embodiments of computer systems that may implement circuits having double-edge-triggered flip-flops in accordance with the disclosure.

Turning now to FIG. 6, various types of systems that may include any of the circuits, devices, or systems discussed above are illustrated. System or device 600, which may incorporate or otherwise utilize one or more of the techniques described herein, may be utilized in a wide range of areas. For example, system or device 600 may be utilized as part of the hardware of systems such as a desktop computer 610, laptop computer 620, tablet computer 630, cellular or mobile phone 640, or television 650 (or set-top box coupled to a television).

Similarly, disclosed elements may be utilized in a wearable device 660, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 600 may also be used in various other contexts. For example, system or device 600 may be utilized in the context of a server computer system, such as a dedicated server or on shared hardware that implements a cloud-based service 670. Still further, system or device 600 may be implemented in a wide range of specialized everyday devices, including devices 680 commonly found in the home such as refrigerators, thermostats, security cameras, etc. The interconnection of such devices is often referred to as the "Internet of Things" (IoT). Elements may also be implemented in various modes of transportation. For example, system or device 600 could be employed in the control systems, guidance systems, entertainment systems, etc. of various types of vehicles 690.

The applications illustrated in FIG. 6 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as design simulation, design synthesis, circuit fabrication, etc.

Figure 7:
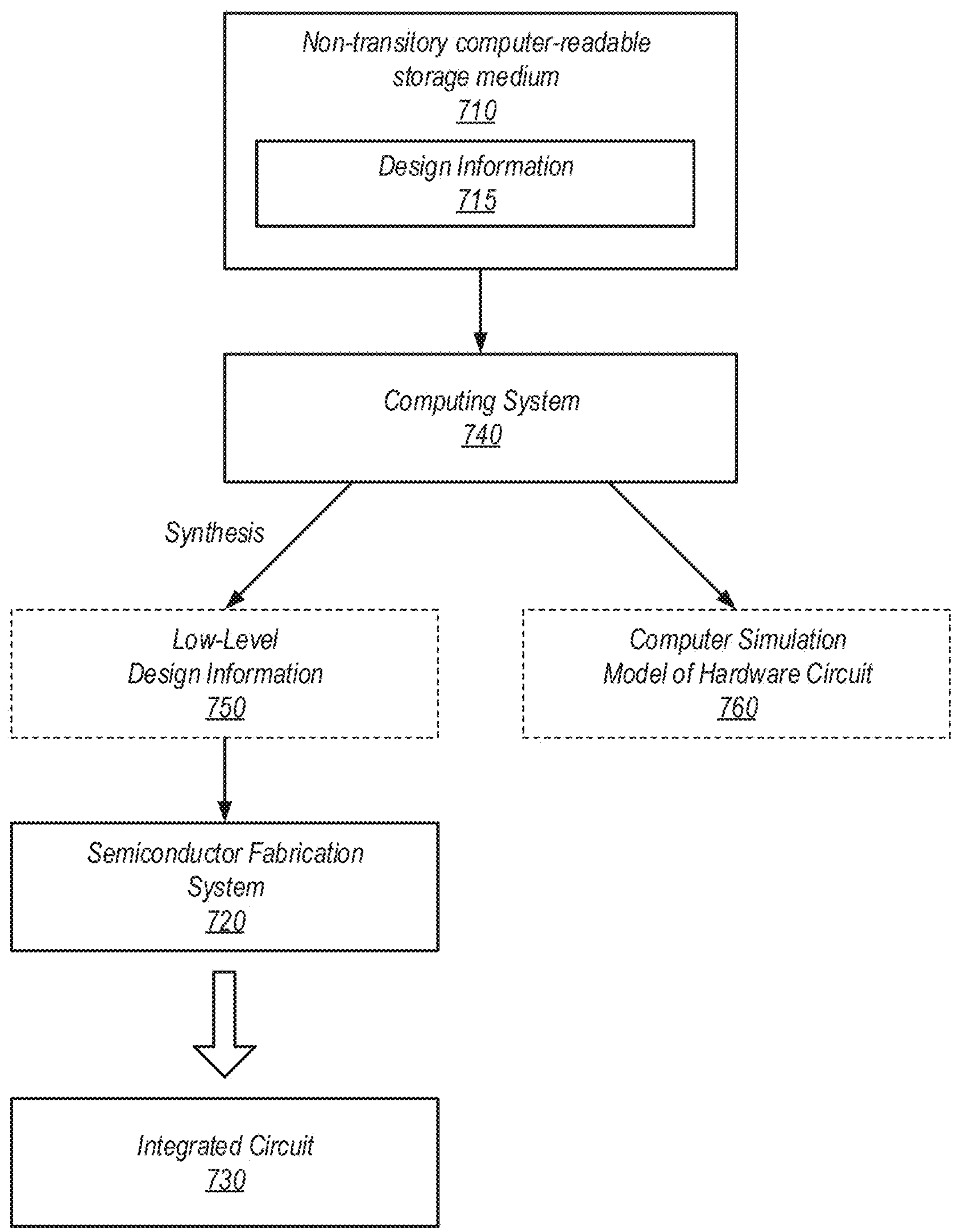
FIG. 7 illustrates an example of a non-transitory computer-readable storage medium that stores circuit design information.

FIG. 7 is a block diagram illustrating an example of a non-transitory computer-readable storage medium that stores design information 715, according to some embodiments. In the illustrated embodiment, computing system 740 is configured to process design information 715. This may include executing instructions included in design information 715, interpreting instructions included in design information 715, compiling, transforming, or otherwise updating design information 715, etc. Therefore, design information 715 controls computing system 740 (e.g., by programming computing system 740) to perform various operations discussed below, in some embodiments.

In the illustrated example, computing system 740 processes design information 715 to generate both computer simulation model of hardware circuit 760 and low-level design information 750. In other embodiments, computing system 740 may generate only one of these outputs, may generate other outputs based on design information 715, or both. Regarding computer simulation model of hardware circuit 760, computing system 740 may execute instructions of a hardware description language that includes register transfer level (RTL) code, behavioral code, structural code, or some combination thereof. The simulation model may perform the functionality specified by design information 715, facilitate verification of the functional correctness of the hardware design, generate power consumption estimates, generate timing estimates, etc.

In the illustrated example, computing system 740 also processes design information 715 to generate low-level design information 750 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on low-level design information 750 (potentially among other inputs), semiconductor fabrication system 720 is configured to fabricate integrated circuit 730 (which may correspond to functionality of the computer simulation model of hardware circuit 760). Note that computing system 740 may generate different simulation models based on design information at various levels of description, including low-level design information 750, design information 715, and so on. The data representing low-level design information 750 and computer simulation model of hardware circuit 760 may be stored on non-transitory computer-readable storage medium 710, or on one or more other media.

In some embodiments, low-level design information 750 controls (e.g., programs) semiconductor fabrication system 720 to fabricate integrated circuit 730. Thus, when processed by the fabrication system, the design information may program the fabrication system to fabricate a circuit that includes various circuitry disclosed herein.

Non-transitory computer-readable storage medium 710 may comprise any of various appropriate types of memory devices or storage devices. Non-transitory computer-readable storage medium 710 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 710 may include other types of non-transitory memory as well, or combinations thereof. Accordingly, non-transitory computer-readable storage medium 710 may include two or more memory media, which may reside in different locations for example, in different computer systems that are connected over a network.

Design information 715 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 740, semiconductor fabrication system 720, or both. In some embodiments, design information 715 may also include one or more cell libraries that specify the synthesis, layout, or both of integrated circuit 730. In some embodiments, design information 715 is specified in whole, or in part, in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 730 may, in various embodiments, include one or more custom macrocells, such as memories, analog or mixed-signal circuits, and the like. In such cases, design information 715 may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 720 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 720 may also be configured to perform various testing of fabricated circuits for correct operation.

In various embodiments, integrated circuit 730 and computer simulation model of hardware circuit 760 are configured to operate according to a circuit design specified by design information 715, which may include performing any of the functionality described herein. For example, integrated circuit 730 may include any of various elements shown in FIGS. 1-7. Further, integrated circuit 730 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model does not imply that the instructions must be executed in order for the element to be met, but rather, specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by design information 715. The different circuit implementations may affect the performance, area, power consumption, etc. of a given design (potentially with tradeoffs between different design goals), but the logical function does not vary among the different circuit implementations of the same circuit design.

In some embodiments, the instructions included in design information 715 provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information included in low-level design information 750. Low-level design information 750 may program semiconductor fabrication system 720 to fabricate integrated circuit 730.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third," when applied to a feature, do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors, or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, a circuit, or a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), a functional unit, a memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as a structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits, or portions thereof, may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:

a communications channel comprising a plurality of flip-flop circuits coupled in series, wherein ones of the plurality of flip-flop circuit are configured to sample data in response to a rising edge and a falling edge of a clock signal, wherein plurality of flip-flop circuits includes a first flip-flop circuit, wherein the first flip-flop circuit includes:

a first latch configured to receive a first bit in response to the rising edge of the clock signal;

a second latch configured to receive a second bit in response to the falling edge of the clock signal; and at least one shadow latch coupled to an output of one of the first latch or the second latch, wherein the shadow latch is configured to receive a third bit from an output of the one of the first latch and the second latch;

wherein, the first flip-flop circuit is configured, during an operational mode, to relay data, via a first output, from the first latch and the second latch on alternating edges of the clock signal; and wherein, the first flip-flop circuit is configured, during a test mode, to relay test data from the shadow latch on an edge of the clock signal opposite that of the one of the first latch or the second latch to which the shadow latch is coupled.

2. The apparatus of claim 1, wherein the first flip-flop circuit includes an input selection circuit configured to select one of an operational mode data input or a scan data input based on a state of a scan enable signal.

3. The apparatus of claim 1, wherein the first flip-flop circuit includes an output selection circuit including the first output, wherein the output selection circuit is configured to relay an output bit from the second latch during a first phase of the clock signal, and further configured to relay an output bit from the first latch during a second phase of the clock signal.

4. The apparatus of claim 1, wherein the shadow latch is coupled to receive the third bit, in response to the rising edge of the clock signal, from the second latch.

5. The apparatus of claim 1, further comprising a second flip-flop circuit having a corresponding input selection circuit couple to an output of the shadow latch of the first flip-flop circuit.

6. The apparatus of claim 1, wherein an output selection circuit of selected ones of the series-coupled plurality of flip-flop circuit are coupled to an input selection circuit to a next one of the of the plurality of series-coupled flip-flop circuits.

7. The apparatus of claim 6, wherein the communications channel further comprises:
- a serializer circuit configured to generate a serialized signal comprising a plurality of bits to be transmitted in series into the communications channel; and
- a de-serializer circuit configured to de-serialize the serialized signal received from the plurality of series-coupled flip-flop circuits;
- wherein, during a given cycle of the clock signal, a given one of the plurality of series-coupled flip-flop circuits is configured to transmit a first one of the plurality of bits and a second one of the plurality of bits.

8. The apparatus of claim 7, further comprising a clock-gating circuit configured to inhibit a clock signal from being provided to inactive ones of the plurality of series-coupled flip-flop circuits, the serializer circuit, and the de-serializer circuit.

9. A method, comprising:
- receiving, by a first flip-flop circuit, an input data signal that encodes a plurality of bits;
- sampling, by the first flip-flop circuit in response to detecting a rising edge of a clock signal, the input data signal to generate a first bit of the plurality of bits;
- sampling, by the first flip-flop circuit in response to detecting falling edge of the clock signal, the input data signal to generate a second bit of the plurality of bits;
- storing, by the first flip-flop circuit, the first bit and the second bit;
- selecting, as an output signal by the first flip-flop circuit, the first bit in response to the clock signal transitioning to a first level, and the second bit in response to the clock signal transitioning to a second level; and
- conveying the output signal to an input of a second flip-flop, wherein the first and second flip-flop form a portion of a communications channel comprising a plurality of series-coupled flip-flop circuits, wherein the method further comprises conveying bits through the communications channel in response to the clock signal transitioning to a first level and in response to the clock signal transitioning to a second level.

10. The method of claim 9, further comprising, in response to activating a test mode:
- receiving, by the first flip-flop circuit, an input test signal comprising one or more test data bits; and
- generating, by the first flip-flop circuit, an output test signal comprising at least one of the one or more test data bits.

11. The method of claim 10, further comprising selecting, using an input selection circuit of the first flip-flop circuit, one of the input test signal or input data signal depending on a state of a test mode signal.

12. The method of claim 10, further comprising:
- storing, in a first latch of the first flip-flop circuit while in an operational mode, the first bit;
- storing, in a second latch of the first flip-flop circuit while in the operational mode, the second bit;
- receiving, in the second latch of the first flip-flop circuit and while in the test mode, the input test signal;
- transferring, while in the test mode, the one of the one or more test data bits of the input test signal from the second latch of the first flip-flop circuit to a third latch of the first flip-flop circuit; and
- outputting, from the third latch of the first flip-flop circuit, the output test signal.

13. The method of claim 12, further comprising:
- selecting, using an output selection circuit of the first flip-flop circuit, the first bit from the first latch of the first flip-flop circuit in response to the clock signal transitioning to the first level while in the operational mode; and
- selecting, using the output selection circuit of the first flip-flop circuit, the second bit from the second latch of the first flip-flop circuit in response to the clock signal transitioning to the second level while in the operational mode.

14. The method of claim 9, wherein the method further comprises:
- serializing, in a serializer circuit, the plurality of bits;
- transmitting, from the serializer and through the plurality of series-coupled flip-flop circuits, the plurality of bits;
- receiving, at a de-serializer circuit and from the plurality of series-coupled flip-flop circuits, the plurality of bits; and
- de-serializing, using the de-serializer circuit, the plurality of bits.

15. The method of claim 14, further comprising inhibiting the clock signal, using a clock-gating circuit, from being provided to inactive ones of the plurality of series-coupled flip-flop circuits, the serializer circuit, and the de-serializer circuit.

16. An apparatus comprising
- a serializer circuit configured to:
  - receive a first signal that encodes a plurality of first bits;
  - receive a second signal that encodes a plurality of second bits;
  - generate, using the first signal and the second signal, a serialized signal that encodes the plurality of first bits and the plurality of second bits;
- a plurality of flip-flop circuits, coupled together in series, wherein ones of the plurality of flip-flop circuits include a first latch configured to latch data in response to a first phase of a clock signal and a second latch configured to latch data in response to a second phase of the clock signal, wherein ones of the plurality of flip-flop circuits further include a third latch, and wherein a given one of the plurality of flip-flop circuits is configured to:
  - relay a first bit encoded in the serialized signal from a preceding flip-flop circuit of the plurality of flip-flop circuits to a subsequent flip-flop circuit of the plurality of flip circuits in response to a rising edge of the clock signal;
  - relay a second bit encoded in the serialized signal from the preceding flip-flop circuit of the plurality of flip-flop circuit to the subsequent flip-flop circuit of the plurality of flip-flop circuits in response to a falling edge of the clock signal; and
  - relay, using the third latch during a test mode, test data from a preceding circuit in a scan chain to a subsequent circuit in the scan chain; and
- a de-serializer circuit configured to:
  - receive the serialized signal from a final flip-flop circuit of the plurality of flip-flop circuits;
  - generate, using the serialized signal, a first output signal that encodes the plurality of first bits; and generate, using the serialized signal, a second output signal that encodes the plurality of second bits.

17. The apparatus of claim 16, further comprising a clock-gating circuit configured to inhibit, when inactive, ones of the serializer circuit, the de-serializer circuit, and plurality of flip-flop circuits from receiving the clock signal.

18. The apparatus of claim 17, wherein the clock-gating circuit includes a plurality of AND-type clock-gating circuits coupled ones of a first subset of the plurality of flip-flop circuits, the serializer circuit, and a plurality of OR-type clock circuits coupled to ones of a second subset of the plurality of flip-flop circuits.

19. The apparatus of claim 18, wherein one of the plurality of AND-type clock-gating circuits and one of the plurality of OR-type clock-gating circuits is coupled to the de-serializer circuit.

20. The apparatus of claim 18, wherein the clock-gating circuit includes a plurality of series-coupled latch circuits configured to propagate an enable signal, and wherein a given one of the plurality of series-coupled latch circuits is further configured to provide the enable signal to a correspondingly coupled one of the plurality of AND-type clock-gating circuits or correspondingly coupled one of the plurality of OR-type clock-gating circuits.

* * * * *